United States Patent [19]
Mitani et al.

[11] Patent Number: 5,702,973
[45] Date of Patent: Dec. 30, 1997

[54] METHOD FOR FORMING EPITAXIAL SEMICONDUCTOR WAFER FOR CMOS INTEGRATED CIRCUITS

[75] Inventors: Kiyoshi Mitani, Isobe, Japan; Witiwat Wijaranakula, Vancouver, Wash.

[73] Assignee: SEH America, Inc., Vancouver, Wash.

[21] Appl. No.: 477,997

[22] Filed: Jun. 7, 1995

Related U.S. Application Data

[60] Division of Ser. No. 212,227, Mar. 14, 1994, abandoned, which is a continuation-in-part of Ser. No. 56,816, Apr. 28, 1993, Pat. No. 5,306,939, which is a continuation of Ser. No. 913,777, Jul. 14, 1992, abandoned, which is a continuation of Ser. No. 684,692, Apr. 12, 1991, abandoned, which is a continuation-in-part of Ser. No. 505,056, Apr. 5, 1990, abandoned.

[51] Int. Cl.$^6$ ............................................. H01L 21/70
[52] U.S. Cl. ....................... 437/57; 437/34; 437/56; 437/58
[58] Field of Search ........................ 257/372, 398, 257/394, 399; 437/57, 34, 56, 58

[56] References Cited

U.S. PATENT DOCUMENTS

| | | | |
|---|---|---|---|
| 4,161,417 | 7/1979 | Yim et al. | 148/175 |
| 4,247,862 | 1/1981 | Klein | 357/48 |
| 4,403,400 | 9/1983 | Sakurai | 29/576 B |
| 4,506,436 | 3/1985 | Bakeman, Jr. et al. | 29/577 C |
| 4,646,124 | 2/1987 | Zunino | 357/43 |
| 5,047,818 | 9/1991 | Tsukamoto | 357/23.6 |
| 5,306,939 | 4/1994 | Mitani et al. | 257/372 |

FOREIGN PATENT DOCUMENTS

| | | |
|---|---|---|
| 0250707 | 1/1988 | European Pat. Off. . |
| 0336977 | 10/1988 | European Pat. Off. . |
| 0336977 | 10/1989 | European Pat. Off. . |
| 3099464 | 4/1991 | European Pat. Off. . |
| 41139758 | 5/1992 | European Pat. Off. . |
| 4212822 | 4/1992 | Germany . |
| 5530855 | 3/1980 | Japan . |
| 5153367 | 11/1980 | Japan . |
| 6097661 | 5/1985 | Japan . |
| 129861 | 6/1986 | Japan . |
| 61-129861 | 6/1986 | Japan . |
| 1240671 | 10/1986 | Japan . |
| 61-240671 | 10/1986 | Japan . |
| 3099464 | 4/1991 | Japan . |
| 4139758 | 5/1992 | Japan . |

OTHER PUBLICATIONS

Sze, et al, Semiconductor Devices . . . , pp. 7, 34–38, 302–316, 472–478 and 492–495, 1985.
Patent Abstracts of Japan, vol. 10, No. 319 (E–450) (2375) Oct. 30, 1986.
Patent Abstracts of Japan, vol. 11, No. 88 (E–490) (2535) Mar. 18, 1987.
Patent Abstracts of Japan, vol. 15, No. 284 (E–1091) Jul. 18, 1991.
Patent Abstracts of Japan, vol. 16, No. 415 (E–1257) Sep. 2, 1992.

(List continued on next page.)

*Primary Examiner*—John Niebling
*Assistant Examiner*—Long Pham
*Attorney, Agent, or Firm*—Loeb & Loeb

[57] ABSTRACT

The present invention is a CMOS epitaxial semiconductor wafer (50) on which CMOS integrated circuits (16) can be manufactured, including such circuits that include bipolar components (referred to as "BiCMOS" circuits). The CMOS wafer includes a lightly doped monocrystalline silicon substrate (56) having a major surface (54) that supports a lightly doped monocrystalline epitaxial silicon layer (52). The substrate includes a heavily doped diffused layer (58) extending a short distance (64) into the substrate from the major surface toward a lightly doped bulk portion (66) of the substrate. CMOS integrated circuits manufactured on the epitaxial layer of the CMOS wafer of this invention have a low susceptibility to latch-up. The low susceptibility is provided by the relatively low resistivity of the diffused layer. Since the diffused layer is relatively thin and the bulk portion is lightly doped, the oxygen content of the bulk can be readily measured and controlled.

21 Claims, 3 Drawing Sheets

OTHER PUBLICATIONS

Muller et al., Device Electronics for Ic's, p. 85, 1986.
Borland, et al., "Advanced CMOS Epitaxial Processing for Latch-up Hardening and Improved Epialyer Quality," 27 Solid State Technology, No. 8, Aug. 1984.
Sze, "Semiconductor . . . and Technology", Bell Tel. Lab., Inc., pp. 302–316 and 492–495, 1985.

5,702,973

METHOD FOR FORMING EPITAXIAL SEMICONDUCTOR WAFER FOR CMOS INTEGRATED CIRCUITS

RELATED APPLICATIONS

This is a division of application Ser. No. 08/212,227, filed Mar. 14, 1994, now abandoned, which is a continuation-in-part of application Ser. No. 08/056,816, filed Apr. 28, 1993, now U.S. Pat. No. 5,306,939 which is a continuation of application Ser. No. 07/913,777 filed Jul. 14, 1992, now abandoned, which is a continuation of application Ser. No. 07/684,692 filed Apr. 12, 1991, now abandoned, which is a continuation-in-part of application Ser. No. 07/505,056 filed Apr. 5, 1990, now abandoned.

TECHNICAL FIELD

The present invention relates to semiconductor wafers that function as the medium on which integrated circuits are manufactured and, in particular, to epitaxial silicon wafers on which CMOS integrated circuits are manufactured.

BACKGROUND OF THE INVENTION

FIG. 1 shows a prior art epitaxial silicon wafer 10 on which a complementary pair of metal-oxide-semiconductor ("MOS") transistors 12 and 14 are arranged as a CMOS circuit 16. Wafer 10 is referred to, therefore, as CMOS wafer 10.

CMOS wafer 10 includes a monocrystalline epitaxial silicon layer 18 that is supported by a monocrystalline silicon substrate 20 formed by the Czochralski method. Epitaxial layer 18 is lightly doped with boron at a concentration of $2 \times 10^{14}$ to $2 \times 10^{15}$ atoms/cm$^3$ to form a p$^-$-type material, and substrate 20 is heavily doped with boron at a concentration of $3 \times 10^{18}$ atoms/cm$^3$ to form a p$^+$-type material. It will be appreciated that epitaxial layer 18 and substrate 20 could alternatively be doped with phosphorus and antimony, respectively, to form n-type materials.

CMOS circuit 16 is formed in and on epitaxial layer 18. Transistor 12 is an n-channel field-effect transistor having a source 22a and a drain 24a coupled by respective n$^+$-type channels 26a and 28a to a gate 30a. A p$^+$-type guard ring 32a provides lateral isolation of transistor 12 in epitaxial layer 18, and a patterned insulating layer 34 of SiO$_2$ provides isolation between source 22a, drain 24a, and gate 30a.

Transistor 14 is a p-channel field effect transistor having a source 22b and a drain 24b coupled by respective p+-type channels 26b and 28b to a gate 30b. Channels 26b and 28b are positioned in an n-type well 36 formed in epitaxial layer 18. An n$^+$-type guard ring 32b provides lateral isolation of transistor 14 in epitaxial layer 18, and insulating layer 34 provides isolation between source 22b, drain 24b, and gate 30b.

The light dopant concentration in epitaxial layer 18 provides it with a resistivity desirable for conventional operation of CMOS circuit 16. Epitaxial layer 18 is formed on heavily doped substrate 20, however, to reduce the susceptibility of CMOS circuit 16 to a phenomenon called latch-up, as described by Borland et al. in Advanced CMOS Epitaxial Processing for Latch-Up Hardening and Improved Epilayer Quality, 27 Solid State Technology, No. 8, August 1984.

Latch-up is a destructive phenomenon in which CMOS circuit structures latch onto a bipolar or junction transistor operating mode. Latch-up occurs when a voltage applied to the CMOS circuit changes rapidly, such as when the power supply voltage is switched on. The changing voltage induces a junction displacement current that initiates latch-up when the current magnitude is greater than a threshold magnitude. The threshold current at which latch-up is initiated decreases as the rate of change of the voltage applied to the CMOS circuit increases.

Although it reduces the susceptibility of CMOS circuit 16 to latch-up, the heavy doping of substrate 20 is disadvantageous because it interferes with the measurement and precipitation of oxygen in substrate 20. Oxygen is an important impurity incorporated into silicon wafers to provide mechanical strength and to facilitate removal of metallic contaminants from the wafer. However, latch-up is such a serious problem in CMOS circuits that most epitaxial CMOS wafers continue to be manufactured on heavily doped substrates.

SUMMARY OF THE INVENTION

An object of the present invention is, therefore, to provide a CMOS epitaxial semiconductor wafer.

Another object of the present invention is to provide such a wafer that reduces the susceptibility of CMOS circuits to latch-up.

A further object of this invention is to provide such a wafer with an oxygen content that can be readily measured and controlled.

The present invention is an epitaxial silicon wafer on which CMOS integrated circuits can be manufactured, including such circuits that include bipolar components (referred to as "BiCMOS" circuits). The epitaxial wafer is referred to, therefore, as a CMOS wafer.

The CMOS wafer of this invention includes a lightly doped monocrystalline silicon substrate having a major surface that supports a lightly doped monocrystalline epitaxial silicon layer. The substrate includes a heavily doped diffused layer extending a short distance into the substrate from the major surface supporting the epitaxial layer.

In a preferred embodiment, the dopant concentrations of the epitaxial layer and the bulk of the substrate range between $2 \times 10^{14}$ and $1 \times 10^{16}$ atoms/cm$^2$ for p-type materials, and between $2 \times 10^{14}$ and $8 \times 10^{17}$ atoms/cm$^3$ for n-type materials. The diffused layer has a dopant concentration of up to about $1 \times 10^{20}$ atoms/cm$^3$ and is relatively thin; extending a distance of between about 1 and 6 µm into a substrate having a thickness of between 0.5 and 1.5 mm.

CMOS integrated circuits manufactured on the epitaxial layer of the CMOS wafer of this invention have a low susceptibility to latch-up. The low susceptibility is provided by the relatively low resistivity of the diffused layer. Since the diffused layer is relatively thin, a bulk of the substrate remains lightly doped. As a result, the oxygen content of the bulk can be readily measured and controlled.

Additional objects and advantages of the present invention will be apparent from the following detailed description of a preferred embodiment thereof, which proceeds with reference to the accompanying drawings.

DETAILED DESCRIPTION OF PREFERRED EMBODIMENTS

Figure 1:
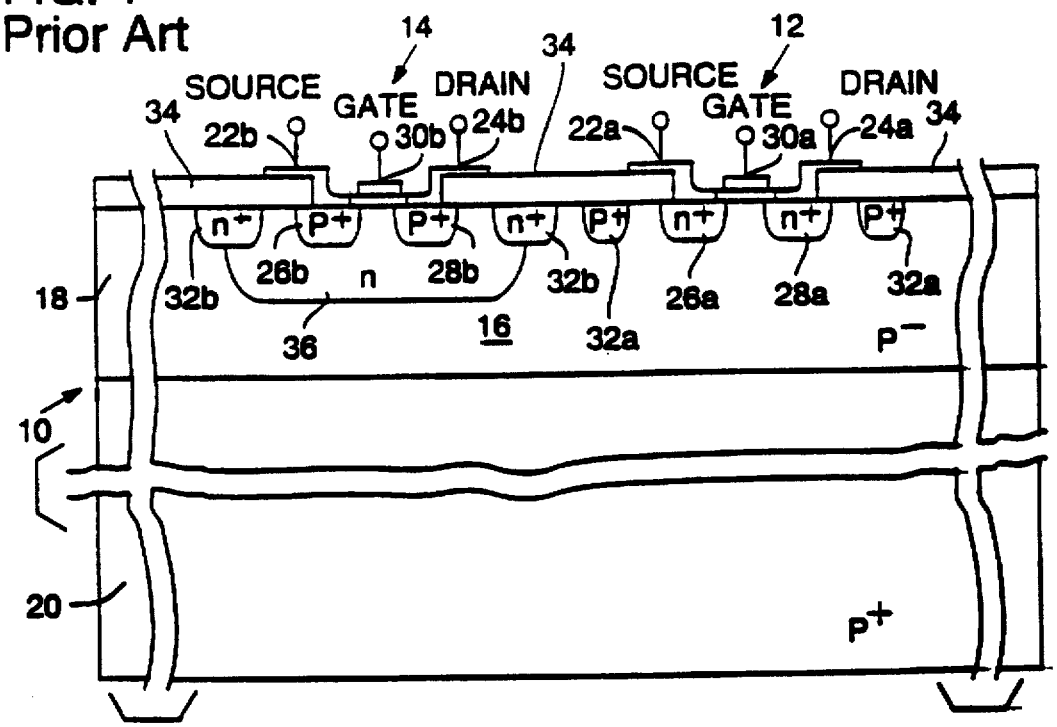
FIG. 1 is a sectional view of a prior art CMOS epitaxial silicon wafer on which a simplified CMOS circuit is formed.
Figure 2:
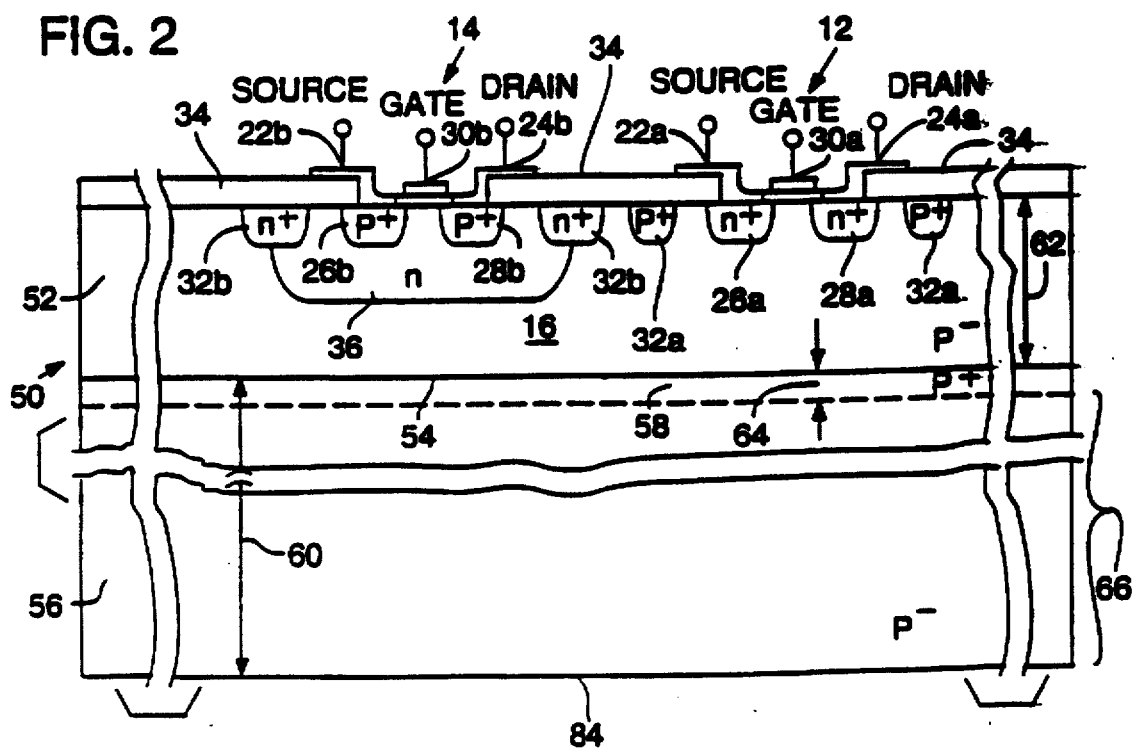
FIG. 2 is a sectional view of a CMOS epitaxial silicon wafer of the present invention with a simplified CMOS circuit formed thereon.

FIG. 2 is a sectional view of an epitaxial silicon wafer 50 of the present invention with a complementary pair of metal-oxide-semiconductor ("MOS") transistors 12 and 14 arranged as a CMOS circuit 16. CMOS circuit 16 is a simplified representation of a CMOS integrated circuit that would typically include a very large number of complementary pairs of MOS transistors. Moreover, CMOS circuit 16 can be coupled to bipolar circuit components manufactured on wafer 50 to form an integrated bipolar-CMOS ("BiCMOS") integrated circuit. As a medium for CMOS circuit 16 and BiCMOS circuits, therefore, wafer 50 is referred to as a CMOS wafer.

CMOS wafer 50 includes a monocrystalline epitaxial silicon layer 52 that is supported by a major surface 54 of a monocrystalline silicon substrate. Epitaxial layer 52 and substrate 56 are lightly doped with boron at a concentration of $8 \times 10^{14}$ atoms/cm$^3$ to form p$^-$-type materials. Substrate 56 includes a heavily doped diffused p$^+$-type layer 58 that extends into substrate 56 from surface 54. Diffused layer 58 has a dopant concentration of up to about $1 \times 10^{20}$ atoms/cm$^3$ and is spread substantially continuously across substrate 56.

Substrate 56 has a thickness 60 of between 0.5 and 1.5 mm, and epitaxial layer 52 has a thickness 62 of between 2 and 15 µm. Diffused layer 58 is relatively thin and extends from major surface 54 into substrate 56 a depth 64 of between about 1 and 6 µm. Depth 64 of diffused layer 58 is between about 0.1% and 0.5% of thickness 60 of substrate 56. As a result, a bulk 66 of substrate 56 constitutes between about 99.5% and 99.9% of thickness 60 and remains lightly doped.

Depth 64 is established by the duration and temperature employed in a drive-in diffusion process by which layer 58 is formed. Depth 64 is defined as the distance from surface 54 to the depth at which the concentration of the diffused dopant is substantially equal to the concentration of the substrate dopant (e.g., $8 \times 10^{14}$ atoms/cm$^3$). Depth 64 is preferably kept to a minimum to maintain a high dopant concentration in diffused layer 58. It will be appreciated, however, that some conventional CMOS circuit fabrication processes will cause up to 2 to 3 µm additional migration of diffused layer 58 into substrate 56.

CMOS circuit 16 is formed in and on epitaxial layer 52. Transistor 12 is an n-channel field-effect transistor having a source 22a and a drain 24a coupled by respective n$^+$-type channels 26a and 28a to a gate 30a. A p$^+$-type guard ring 32a provides lateral isolation of transistor 12 in epitaxial layer 52, and a patterned insulating layer 34 of SiO$_2$ provides isolation between source 22a, drain 24a, and gate 30a. Channels 26a and 28a are formed by an arsenic ion implantation at 80 KeV with a dose of $5 \times 10^{15}$ ions/cm$^2$. Guard ring 32a is formed by a boron ion implantation at 25 KeV with a dose of $3 \times 10^{13}$ ions/cm$^2$.

Transistor 14 is a p-channel field effect transistor having a source 22b and a drain 24b coupled by respective p$^+$-type channels 26b and 28b to a gate 30b. Channels 26b and 28b are positioned in an n-type well 36 formed in epitaxial layer 52. An n$^+$-type guard ring 32b provides lateral isolation of transistor 12 in epitaxial layer 52, and SiO$_2$ pattern 34 provides isolation between source 22b, drain 24b, and gate 30b. Channels 26b and 28b are formed by a BF$_2^+$ ion implantation at 45 KeV with a dose of $3 \times 10^{15}$ ions/cm$^3$. Guard ring 32b is formed by arsenic or phosphorus ion implantations at 60 KeV with the dose of $6 \times 10^{13}$ ions/cm$^2$, and well 36 is formed by a moderate doping of phosphorus at a concentration of $10^{17}$ atoms/cm$^3$.

Figure 3:
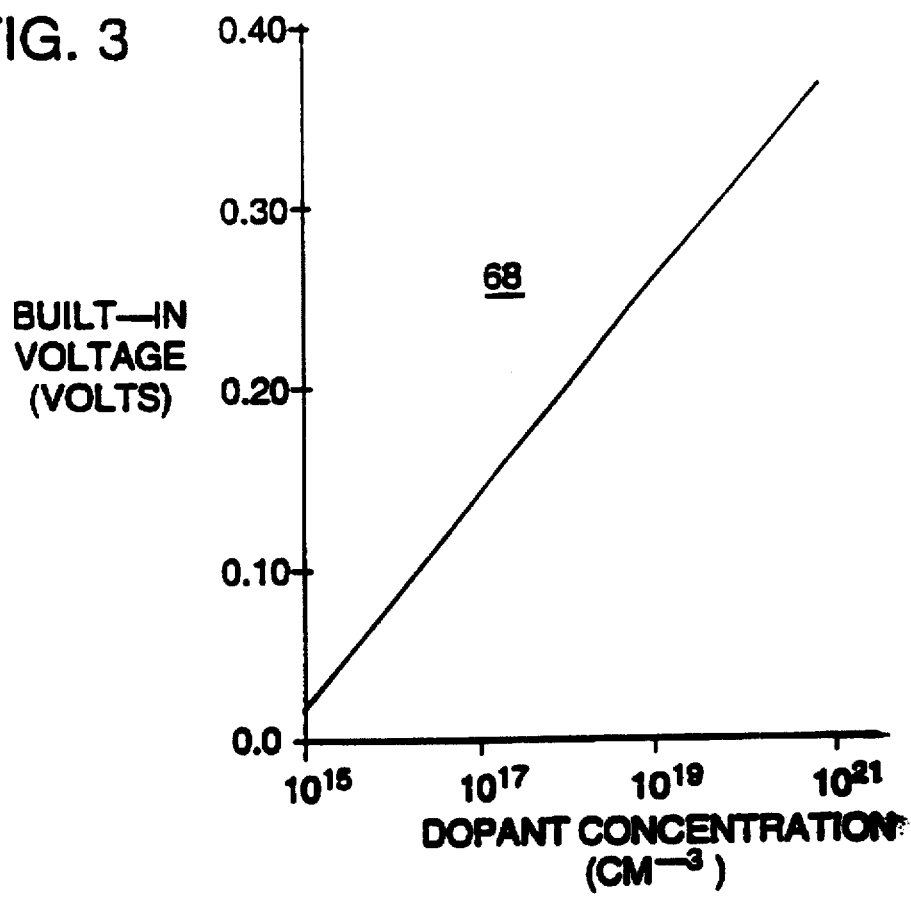
FIG. 3 is a graph showing the relationship between the dopant concentration in a heavily doped diffused layer in the CMOS wafer of the present invention and the resulting built-in voltage that inhibits latch-up.

FIG. 3 is a graph 68 showing the relationship between the dopant concentration in diffused layer 58 and a "built-in" voltage $V_B$ generated across major surface 54 in epitaxial layer 52 and substrate 56. The built-in voltage $V_B$ reduces a junction displacement current between n-well 36 and p-type substrate 56. Latch-up is initiated whenever the displacement current magnitude is greater than a threshold value. Accordingly, the susceptibility of CMOS circuit 16 to latch-up is decreased in inverse proportion to the magnitude of the built-in voltage $V_B$.

Graph 68 shows that increasing dopant concentration in diffused layer 58 increases the built-in voltage $V_B$. A practical limit for the dopant concentration in diffused layer 58 is the solid solubility limit of $1 \times 10^{20}$ atoms/cm$^3$, because higher concentrations of dopant impurities become electrically inactive. Graph 68 is computed with reference to epitaxial layer 52 and substrate 56 each having a boron concentration of $5 \times 10^{14}$ atoms/cm$^3$ and at a temperature of 20° C.

Figure 4:
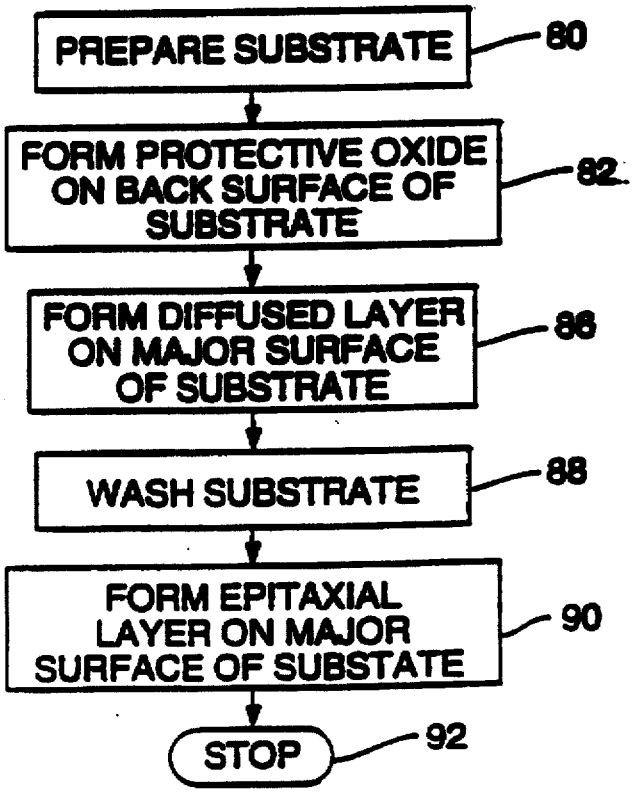
FIG. 4 is a flow diagram showing the process for manufacturing the CMOS wafer of FIG. 2.

FIG. 4 is a flow diagram showing a method of manufacturing CMOS wafer 50. The method is described with reference to epitaxial layer 52 and substrate 56 being manufactured as p-type materials. It will be appreciated, however, that CMOS wafer 50 can alternatively be manufactured as n-type materials.

Process block 80 indicates that substrate 56 is prepared from a silicon crystal ingot (not shown) grown in accordance with the Czochralski method. The crystal is formed with a surface orientation in the (100) plane and a light boron doping at a concentration of between $2 \times 10^{14}$ and $1 \times 10^{18}$ atoms/cm$^3$ to provide a p$^-$-type material with a resistivity of between 1 and 50 ohm-cm. Substrate 56 is then sliced from the ingot, etched, and polished.

Process block 82 indicates that a thin protective layer of SiO$_2$ (not shown) is formed on back surface 84 of substrate 56 by low-temperature chemical vapor deposition. The protective oxide layer prevents contamination of substrate 56 at back surface 84 during subsequent formation of diffused layer 58. Such contamination is sometimes referred to as autodoping.

Autodoping occurs when the dopant material applied to major surface 54 for diffusion incidentally spreads to back surface 84. The formation of the protective oxide layer is an inexpensive, simple, and effective method of preventing the dopant material from reaching back surface 84. The chemical vapor deposition process employs silane that is decomposed at a temperature of 470° C. to form an oxide with a thickness of between 200 and 1,000 nm.

Process block 86 indicates that diffused layer 58 is formed at major surface 54 of substrate 56. For example, a boron dopant material is applied to major surface 54. One such dopant material is a proprietary spin-on boron compound manufactured by Emulsitone Co., 19 Leslie Court, Whippany, N.J. 07981. Alternative boron dopants include BN, BCl$_3$, BBr$_3$, B$_2$H$_6$. The dopant is diffused into substrate 54 by heating the substrate at a drive-in temperature of about 1200° C.

In particular, the spin-on boron compound is diffused into wafer 54 to the depth 64, which is between about 1 and 6 μm when the drive-in temperature is maintained for diffusion times of between 5 and 200 minutes, respectively. Since thickness 60 of substrate 56 is between 0.5 and 1.5 mm, diffused layer 58 extends into substrate 56 about 0.1% to 0.5% of thickness 60. Lightly doped bulk 66 constitutes, therefore, 99.5% to 99.9% of substrate 56. Persons skilled in the art would be familiar with the drive-in diffusion times and temperatures suited to different dopants and different depths.

Process block 88 indicates that substrate 54 is washed in hydrofluoric acid to remove the protective oxide layer on back surface 84 and any dopant material remaining on major surface 56 after the diffusion of step 86. The acid wash is conducted in accordance with the cleaning procedure described by Kern in Hydrogen Peroxide Solutions for Silicon Wafer Cleaning, 28 RCA Engineer 99 (1983).

Process block 90 indicates that epitaxial layer 52 is formed on major surface 54 by means of epitaxial chemical vapor deposition. Epitaxial layer 52 is formed with a boron dopant concentration of between $2 \times 10^{14}$ and $2 \times 10^{15}$ atoms/cm$^3$. Deposition preferably occurs at or below a temperature of about 1150° C. to minimize further migration of diffused layer 58 into substrate 54.

Termination block 92 indicates that the formation of epitaxial layer 52 at process block 90 completes the manufacture of CMOS wafer 50.

A CMOS wafer manufactured with n-type materials would require different drive-in diffusion times and temperatures to achieve the preferred diffused layer depth 64 of between 1 and 6 μm and resistivity of between 0.02 and 0.006 ohm-cm. For example, antimony could be applied to surface 54 as a solid in the form of $Sb_2O_3$ and $Sb_2O_4$, and as a liquid in the form of $Sb_3Cl_5$ via a bubbler system. Alternatively, arsenic could be applied via ion implantation. For antimony applied as solid $Sb_2O_3$, diffusion times of 22 and 800 minutes at 1200° C. would provide diffusion depths of 1 and 6 μm, respectively.

Dopant concentrations as low as $2 \times 10^{14}$ atoms/cm$^3$ in substrate 56 cooperate with heavily doped diffused layer 58 to beneficially reduce the incidence of latch-up in CMOS integrated circuits. Typically, commercially available CMOS wafers have dopant concentrations of at least $8 \times 10^{14}$ atoms/cm$^3$, and such concentrations provide greater prevention of latch-up in CMOS integrated circuits formed on wafers of the present invention.

The low resistivity of diffused layer 58 reduces the susceptibility of CMOS circuit 16 to latch-up and allows bulk 66 of substrate 56 to remain lightly doped. A substrate with a dopant concentration of $10^{14}$ atoms/cm$^3$ has such a high resistivity that latch-up in CMOS devices formed on the structure would be enhanced rather than reduced. The reason is that the high resistivity would enhance current flow through the transistors of a CMOS circuit.

A benefit of the light doping of bulk 66 is that interstitial oxygen therein can be accurately measured with conventional nondestructive measurement equipment. Such oxygen is important because it provides mechanical strength to the wafer that prevents it from warping, which reduces the manufacturing yield of such wafers.

In addition, the light doping facilitates the precipitation of oxygen within bulk 66. The amount of oxygen precipitated in a wafer is represented as the difference between the interstitial oxygen concentrations before and after the device manufacturing process. Such precipitation is beneficial because it creates microscopic defects ("microdefects") that act as gettering sites for removing undesirable metallic contaminants within bulk 66. Removal of such contaminants is important because they decrease the yield and performance of CMOS circuit devices formed on the wafer.

Test samples of a CMOS wafer 50 ("test wafers 50") of the present invention have been manufactured and tested to demonstrate the benefits set forth above. Each of test wafers 50 included a (100)-oriented substrate 56 doped with boron to a resistivity of 10–15 ohm-cm. The interstitial oxygen content of substrate 56 prior to incorporation of diffused layer 58 or epitaxial layer 52 was measured with a conventional nondestructive Fourier transform infrared spectroscope as 26–28 ppma (parts per million atoms), which complies with the ASTM F121-79 standard established by the American Society for Testing and Materials.

To simulate the processing that they would undergo during the manufacture of CMOS circuit 16, test wafers 50 were subjected to a 16-hour simulated anneal cycle at 1050° C. in dry, ambient oxygen. In particular, test wafers 50 were inserted at a rate of 25 cm per minute into a diffusion furnace at a temperature of 800° C. The temperature within the diffusion furnace was then increased at a rate of 5° C. per minute until it reached 1050° C., which was held for 16 hours and then reduced to 800° C. at a rate of 2° C. per minute. Test wafers 50 were then dipped in hydrofluoric acid to remove an oxide layer formed during the simulated anneal.

Table 1 lists the concentration of interstitial oxygen measured in test wafers 50 at a time $t_1$ immediately prior to the drive-in diffusion of step 86, a time $t_2$ immediately after the deposition of epitaxial layer 52 of step 90, and a time $t_3$ immediately after the simulated anneal. The concentration was measured with a conventional nondestructive Fourier transform infrared spectroscope.

TABLE 1

| Time | Oxygen Concentration (Parts Per Million Atoms) |
|---|---|
| $t_1$ | 26.7–28.5 |
| $t_2$ | 23.6–28.0 |
| $t_3$ | 19.5–21.9 |

In contrast, a Fourier transform infrared spectroscope is unable to measure the interstitial oxygen concentration of a conventional epitaxial CMOS wafer because of the heavy doping (e.g., $2 \times 10^{18}$ atoms/cm$^3$) of the substrate. The interstitial oxygen content of such wafers must be measured, therefore, with a destructive method called secondary ion mass spectroscopy.

Oxygen precipitation within a CMOS wafer is desirable because it creates microscopic defects ("microdefects") in the form of oxide precipitates that function as gettering sites for removing undesirable metallic contaminants from the wafer. A benefit of CMOS wafers 50 of this invention is that the light dopant concentration in bulk 66 does not interfere with the precipitation of oxygen as does the heavy doping of conventional CMOS wafers.

To demonstrate the increased number of microdefects in bulk 66, test wafers 50 subjected to the simulated anneal process described above were cleaved and preferentially etched for 1.25 minutes in an etch solution of the type described by F. Secco D'Aragona, 119 Journal of the Electrochemical Society 948 (1972). The microdefects on the cleaved surfaces were examined and counted under and optical light microscope at 200× magnification.

The cleaved surfaces of test wafers 50 each had between about 5.5×10⁸ and 6.5×10⁸ microdefects per cubic centimeter. In contrast, no microdefects were detected on the cleaved surface of a conventional CMOS wafer that had been annealed and etched in a similar manner. Since the number of microdefects is directly related to the extent of oxygen precipitation, these tests demonstrate that the low dopant concentration in bulk 66 of CMOS wafer 50 greatly facilitates the precipitation of oxygen.

The ability to measure the concentration of interstitial oxygen with nondestructive techniques, as provided by the present invention, allows determination of the amount of oxygen precipitated during integrated circuit manufacturing processes. While some oxygen precipitation within a CMOS wafer is desirable to provide gettering sites, excessive oxygen precipitation reduces mechanical strength in the wafer, resulting in wafer warpage and slip generation. It will be appreciated, therefore, that the measurement capabilities provided by the present invention can prevent excessive oxygen precipitation during integrated circuit manufacturing processes.

Figure 5:
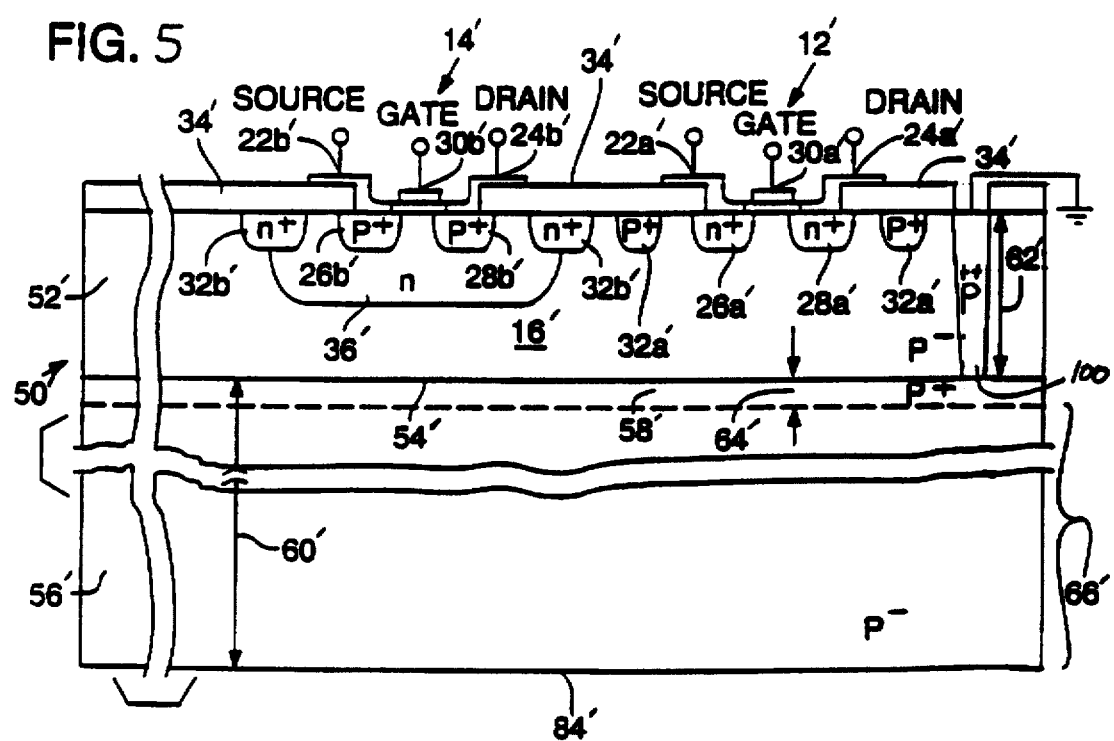
FIG. 5 is a sectional view of an alternative CMOS epitaxial silicon wafer of the present invention with a simplified CMOS circuit formed thereon.

FIG. 5 is a sectional view of an alternative epitaxial silicon wafer 50' of the present invention with a complementary pair of metal-oxide-semiconductor ("MOS") transistors 12' and 14' arranged as a CMOS circuit 16'. Wafer 50' and CMOS circuit 16' include components that are substantially the same as those of wafer 50 and CMOS circuit 16 of FIG. 2 and are identified by common reference numerals with a prime designator. The description hereinabove directed to wafer 50 and CMOS circuit 16 is similarly applicably to wafer 50' and CMOS circuit 16', except as specified below.

As is conventional with integrated circuits, CMOS circuit 16 of FIG. 2 would typically include an electrical connection (not shown) between back surface 84 and electrical ground. As an alternative to such a conventional ground connection, CMOS circuit 16' includes a heavily doped, highly conductive well 100 that extends through epitaxial layer 52' to diffused layer 58'.

Conductive well 100 is formed by etching a trench in a SF₆/O₂ or BCl₃/Cl₂ reactive ion-plasma etching (REI) reactor as described by Robb et al. in *Semiconductor Silicon 1990*, edited by Huff et al., Symposium Proceeding of the Electrochemical Society, Pennington, N.J. 1990, p. 801. The trench is then filled with polysilicon formed by low pressure chemical vapor deposition (LPCVD) and doped to a concentration of at least 1×10¹⁹ atoms/cm³ with, for example, boron for p⁺-type diffused layer 58' or phosphorus for n⁺-type diffused layer 58. Accordingly, conductive well 100 preferably has a resistivity of 0.005 ohm-cm or less.

It will be appreciated that the filling of the trench could be performed by other methods, such as physical vapor deposition (PVD) of titanium and tungsten silicide to obtain a low resistivity conductive well 100. The PVD method has been described by Eguchi et al. in *Process Physics and Modeling in Semiconductor Technology*, edited by Srinivasan et al., Symposium Proceeding of the Electrochemical Society, Pennington, N.J. 1993, p. 301.

Electrically grounding diffused layer 58' via conductive well 100 prevents heat generation that could be caused by current flowing through lightly doped substrate 56' to a ground connection on rear surface 84'. To facilitate formation of conductive well 100, thickness 62' of epitaxial layer 52' is preferably between 2 and 3 μm.

It will be obvious to those having skill in the art that many changes may be made in the above-described details of the preferred embodiment of the present invention without departing from the underlying principles thereof. The scope of the present invention should, therefore, be determined only by the following claims.

We claim:

1. A method of forming a CMOS semiconductor wafer on which CMOS integrated circuits are formed in an epitaxial layer of semiconductor material positioned on a major surface region of a semiconductor substrate, comprising:

forming the semiconductor substrate by Czochralski processing to have an electrically active dopant concentration of no less than 2×10¹⁴ atoms/cm³;

before the epitaxial layer of semiconductor material is formed on the major surface region of a semiconductor substrate, forming a thin, high conductance diffused layer extending into the semiconductor substrate from the major surface region and being continuous across the entire major surface region of the substrate, the electrically active dopant concentration of the substrate cooperating with the high conductance of the diffused layer to provide across the diffused layer a built-in voltage that prevents latch-up in CMOS circuits formed on the semiconductor wafer; and measuring the concentration of interstitial oxygen in the CMOS semiconductor wafer before and after formation of CMOS integrated circuits on the semiconductor wafer.

2. The method of claim 1 in which the concentration of interstitial oxygen in the CMOS semiconductor wafer is measured by a Fourier transform infrared spectroscopy.

3. A method of forming a CMOS semiconductor wafer on which CMOS integrated circuits are formed in an epitaxial layer of semiconductor material positioned on a major surface region of a semiconductor substrate, comprising:

forming the semiconductor substrate by Czochralski processing to have an electrically active dopant concentration of no less than 2×10¹⁴ atoms/cm³;

before the epitaxial layer of semiconductor material is formed on the major surface region of a semiconductor substrate, forming a thin, high conductance diffused layer extending into the semiconductor substrate from the major surface region and being continuous across the entire major surface region of the substrate, the electrically active dopant concentration of the substrate cooperating with the high conductance of the diffused layer to provide across the diffused layer a built-in voltage that prevents latch-up in CMOS circuits formed on the semiconductor wafer; and forming a highly conductive well that extends through the epitaxial layer to the high conductance diffused layer.

4. The method claim 3 in which the epitaxial layer through which the highly conductive well extends is formed with a thickness of 2–3 micrometers.

5. The method of claim 3 in which the highly conductive well is formed with a resistivity of 0.005 ohm-cm or less.

6. The method of claim 3 in which forming the highly doped conductive well includes forming a trench by reactive ion-plasma etching.

7. The method of claim 3 in which the electrically active dopant concentration in the semiconductor substrate is no less than 8×10¹⁴ atoms/cm³.

8. The method of claims 3 in which forming the semiconductor substrate including forming a substrate having a resistivity of between 1 and 50 ohm-cm.

9. The method of claim 3 in which the semiconductor substrate has a thickness and in which forming a thin, high conductance diffused layer including forming a diffused layer that extends into the substrate a depth that is less than 1% of the thickness of the substrate.

10. The method of claim 3 in which forming a thin, high conductance diffused layer including forming a diffused layer that extends into the substrate a depth of between 1 and 6 micrometers.

11. The method of claim 3 in which forming the semiconductor substrate including forming a substrate in which the semiconductor material includes silicon.

12. The method of claim 3 in which forming the semiconductor substrate including forming a substrate having an electrically active dopant concentration of no less than $8 \times 10^{14}$ atoms/cm$^3$.

13. The method of claim 3 in which forming a highly conductive well includes depositing doped polycrystalline silicon.

14. The method of claim 13 in which the doped polysilicon is deposited by chemical vapor deposition.

15. The method of claim 3 in which forming a highly conductive well includes depositing a material by physical vapor deposition.

16. The method of claim 3 in which forming a highly conductive well includes depositing a silicide material.

17. The method of claim 3 further comprising measuring the concentration of interstitial oxygen in the CMOS semiconductor wafer before and after formation of CMOS integrated circuits on the semiconductor wafer.

18. The method of claim 1 in which forming the semiconductor substrate by Czochralski processing includes forming a semiconductor substrate comprising silicon.

19. The method of claim 1 in which forming a thin, high conductance diffused layer includes forming a diffused layer of between about 1 μm and about 6 μm in thickness.

20. The method of claim 1 further comprising forming an epitaxial layer having a thickness of between about 2 μm and about 15 μm.

21. The method of claim 1 further comprising forming a highly conductive well that extends through the epitaxial layer to the high conductance diffused layer.

\* \* \* \* \*